United States Patent
Hong et al.

(10) Patent No.: US 10,825,723 B2
(45) Date of Patent: Nov. 3, 2020

(54) SEMICONDUCTOR DEVICE AND METHOD FOR MAKING THE SAME

(71) Applicant: Samsung Electronics Co., Ltd., Suwon-si (KR)

(72) Inventors: Joon Goo Hong, Austin, TX (US); Harsono Simka, Saratoga, CA (US); Mark Stephen Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/283,341

(22) Filed: Feb. 22, 2019

(65) Prior Publication Data
US 2020/0135549 A1    Apr. 30, 2020

Related U.S. Application Data

(60) Provisional application No. 62/750,709, filed on Oct. 25, 2018.

(51) Int. Cl.
| | |
|---|---|
| *H01L 23/49* | (2006.01) |
| *H01L 21/768* | (2006.01) |
| *H01L 21/02* | (2006.01) |
| *H01L 23/522* | (2006.01) |
| *H01L 23/528* | (2006.01) |

(52) U.S. Cl.
CPC .. *H01L 21/76831* (2013.01); *H01L 21/02118* (2013.01); *H01L 21/76802* (2013.01); *H01L 21/76843* (2013.01); *H01L 21/76877* (2013.01); *H01L 23/5226* (2013.01); *H01L 23/5283* (2013.01)

(58) Field of Classification Search
CPC ......... H01L 21/76802; H01L 21/76843; H01L 21/76877; H01L 23/5226; H01L 23/5283
USPC ......................................................... 257/774
See application file for complete search history.

(56) References Cited

U.S. PATENT DOCUMENTS

| | | | | |
|---|---|---|---|---|
| 6,229,211 | B1 * | 5/2001 | Kawanoue | ........ H01L 21/76843 257/750 |
| 6,905,958 | B2 * | 6/2005 | Gracias | .................. B82Y 30/00 257/E21.579 |
| 7,728,436 | B2 | 6/2010 | Whelan et al. | |
| 9,613,907 | B2 | 4/2017 | Hegde et al. | |
| 2009/0197404 | A1 * | 8/2009 | Yang | ................. H01L 21/02063 438/652 |
| 2010/0301491 | A1 * | 12/2010 | Yang | ................. H01L 21/76831 257/773 |

(Continued)

*Primary Examiner* — Nitin Parekh
(74) *Attorney, Agent, or Firm* — Lewis Roca Rothgerber Christie LLP (57) ABSTRACT

In a method of making a semiconductor device, the method includes: forming a first conductive layer over a substrate; forming an insulating layer on the first conductive layer; forming a via through the insulating layer to expose the first conductive layer; forming a self-assembled monolayer (SAM) over a bottom of the via; forming a barrier layer at a sidewall of the via; removing the SAM over the bottom of the via; and forming a second conductive layer over the barrier layer and the bottom of the via such that the first conductive layer is electrically connected to the second conductive layer without the barrier layer between the first conductive layer and the second conductive layer at the bottom of the via.

18 Claims, 9 Drawing Sheets

(56) References Cited

U.S. PATENT DOCUMENTS

| | | | |
|---|---|---|---|
| 2013/0270703 A1* | 10/2013 | Zierath | H01L 21/76879 257/751 |
| 2014/0048859 A1* | 2/2014 | Nakano | C23C 16/45525 257/296 |
| 2015/0137373 A1* | 5/2015 | Zhang | H01L 23/53266 257/751 |
| 2016/0035844 A1* | 2/2016 | Uchimura | H01L 29/7827 257/330 |
| 2017/0323781 A1 | 11/2017 | Kachian et al. | |
| 2018/0033646 A1* | 2/2018 | Sharangpani | H01L 21/311 |
| 2018/0082942 A1 | 3/2018 | Chawla et al. | |
| 2018/0261500 A1 | 9/2018 | Bajaj et al. | |

* cited by examiner

SEMICONDUCTOR DEVICE AND METHOD FOR MAKING THE SAME

CROSS-REFERENCE TO RELATED APPLICATION

The present application claims priority to and the benefit of U.S. Provisional Patent Application No. 62/750,709, entitled "METHOD FOR DAMASCENE PROCESS TO IMPROVE VIA RESISTANCE", filed on Oct. 25, 2018, the entire content of which is incorporated herein by reference.

BACKGROUND

Aspects of some example embodiments of the present invention are directed to a semiconductor device and a method of making the same.

Semiconductor devices are commonly found in modern electronic products. Semiconductor devices vary in the number and density of electrical components. Discrete semiconductor devices generally contain one type of electrical component, e.g., light emitting diodes (LEDs), small signal transistors, resistors, capacitor, inductors, and power metal oxide semiconductor field effect transistors (MOSFETs). Integrated semiconductor devices typically contain hundreds to millions of electrical components.

The above information in the Background section is only for enhancement of understanding of the background of the technology and therefore it should not be construed as admission of existence or relevancy of the prior art.

SUMMARY

Aspects of some example embodiments of the present invention are directed to a semiconductor device and a method of making the same.

According to some example embodiments of the present disclosure, in a method of making a semiconductor device, the method includes: forming a first conductive layer over a substrate; forming an insulating layer on the first conductive layer; forming a via through the insulating layer to expose the first conductive layer; forming a self-assembled monolayer (SAM) over the insulating layer, a sidewall of the via, and a bottom of the via in contact with the first conductive layer; removing a first portion of the SAM over the insulating layer, while leaving a second portion of the SAM at the sidewall of the via and the bottom of the via; removing the SAM from the sidewall of the via, while leaving the SAM at the bottom of the via; forming a barrier layer at the sidewall of the via; removing the SAM from the bottom of the via to expose the first conductive layer; and forming a second conductive layer over the barrier layer and the bottom of the via such that the first conductive layer is electrically connected to the second conductive layer without the barrier layer between the first conductive layer and the second conductive layer at the bottom of the via.

According to some example embodiments, the method further includes, after forming the SAM over the insulating layer, the sidewall of the via, and the bottom of the via, forming a sacrificial layer over the SAM.

According to some example embodiments, the sacrificial layer comprises an organic material.

According to some example embodiments, the method further includes, removing a first portion of the sacrificial layer outside of the via, while leaving a second portion of the sacrificial layer inside the via to maintain coverage over the SAM within the via.

According to some example embodiments, the method further includes, removing the first portion of the SAM over the insulating layer, wherein prior to being removed, the first portion of the SAM is not covered by the second portion of the sacrificial layer.

According to some example embodiments, the method further includes, removing the second portion of the sacrificial layer inside the via to expose the SAM within the via.

According to some example embodiments, prior to removing the SAM at the sidewall of the via, the SAM at the sidewall of the via has a thickness that is less than the SAM at the bottom of the via.

According to some example embodiments of the present disclosure, in a method of making a semiconductor device, the method includes: forming a first conductive layer over a substrate; forming an insulating layer on the first conductive layer; forming a via through the insulating layer to expose the first conductive layer; forming a self-assembled monolayer (SAM) over a bottom of the via; forming a barrier layer at a sidewall of the via; removing the SAM over the bottom of the via; and forming a second conductive layer over the barrier layer and the bottom of the via such that the first conductive layer is electrically connected to the second conductive layer without the barrier layer between the first conductive layer and the second conductive layer at the bottom of the via.

According to some example embodiments, the method further includes forming the SAM at the sidewall of the via.

According to some example embodiments, the method further includes removing the SAM at the sidewall of the via, while leaving the SAM at the bottom of the via.

According to some example embodiments, prior to removing the SAM at the sidewall of the via, a thickness of the SAM at the sidewall of the via is less than a thickness of the SAM at the bottom of the via.

According to some example embodiments, the method further includes, after forming the SAM at the sidewall of the via, and the bottom of the via, forming a sacrificial layer over the SAM.

According to some example embodiments, the sacrificial layer comprises an organic material.

According to some example embodiments, the method further includes, forming the SAM over the insulating layer.

According to some example embodiments, the method further includes, removing a first portion of the SAM over the insulating layer, while leaving a second portion of the SAM at the sidewall and the bottom of the via.

According to some example embodiments of the present disclosure, in a method of making a semiconductor device, the method includes: forming a first conductive layer over a substrate; forming an insulating layer on the first conductive layer; forming a via through the insulating layer to expose the first conductive layer; forming a barrier layer at a sidewall of the via, without forming the barrier layer at a bottom of the via; and forming a second conductive layer over the barrier layer and the bottom of the via.

According to some example embodiments, the method further includes forming a self-assembled monolayer (SAM) over the bottom of the via prior to depositing the barrier layer.

According to some example embodiments, the method further includes removing the SAM from the bottom of the via prior to depositing the second conductive layer.

According to some example embodiments, the method further includes: forming the SAM at the sidewall of the via and the bottom of the via prior to forming the barrier layer; and removing the SAM at the sidewall of the via, wherein, prior to removing the SAM at the sidewall of the via, a thickness of the SAM at the sidewall of the via is less than a thickness of the SAM at the bottom of the via.

According to some example embodiments of the present disclosure, a semiconductor device includes: a first conductive layer over a substrate; an insulating material on the first conductive layer, wherein a via is formed through the insulating material; a barrier layer over the insulating material and within the via at a sidewall of the via without being at a bottom portion of the via; and a second conductive layer over the barrier layer and within the via, wherein the barrier layer is not between the first conductive layer and the second conductive layer at the bottom portion of the via.

BRIEF DESCRIPTION OF THE DRAWINGS

A more complete appreciation of the present disclosure, and many of the attendant features and aspects thereof, will become more readily apparent as the disclosure becomes better understood by reference to the following detailed description when considered in conjunction with the accompanying drawings, wherein.

DETAILED DESCRIPTION

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Aspects and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims.

The use of the terms "a" and "an" and "the" and similar referents in the context of describing the invention (especially in the context of the following claims) are to be construed to cover both the singular and the plural, unless otherwise indicated or clearly contradicted by the context. The terms "comprising," "having," "including," and "containing" are to be construed as open-ended terms (i.e., meaning "including, but not limited to,") unless otherwise noted.

Unless defined otherwise, all technical and scientific terms used herein have the meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. Examples of integrated semiconductor devices include microcontrollers, microprocessors, charged-coupled devices (CCDs), solar cells, and digital micro-mirror devices (DMDs).

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Figure 1:
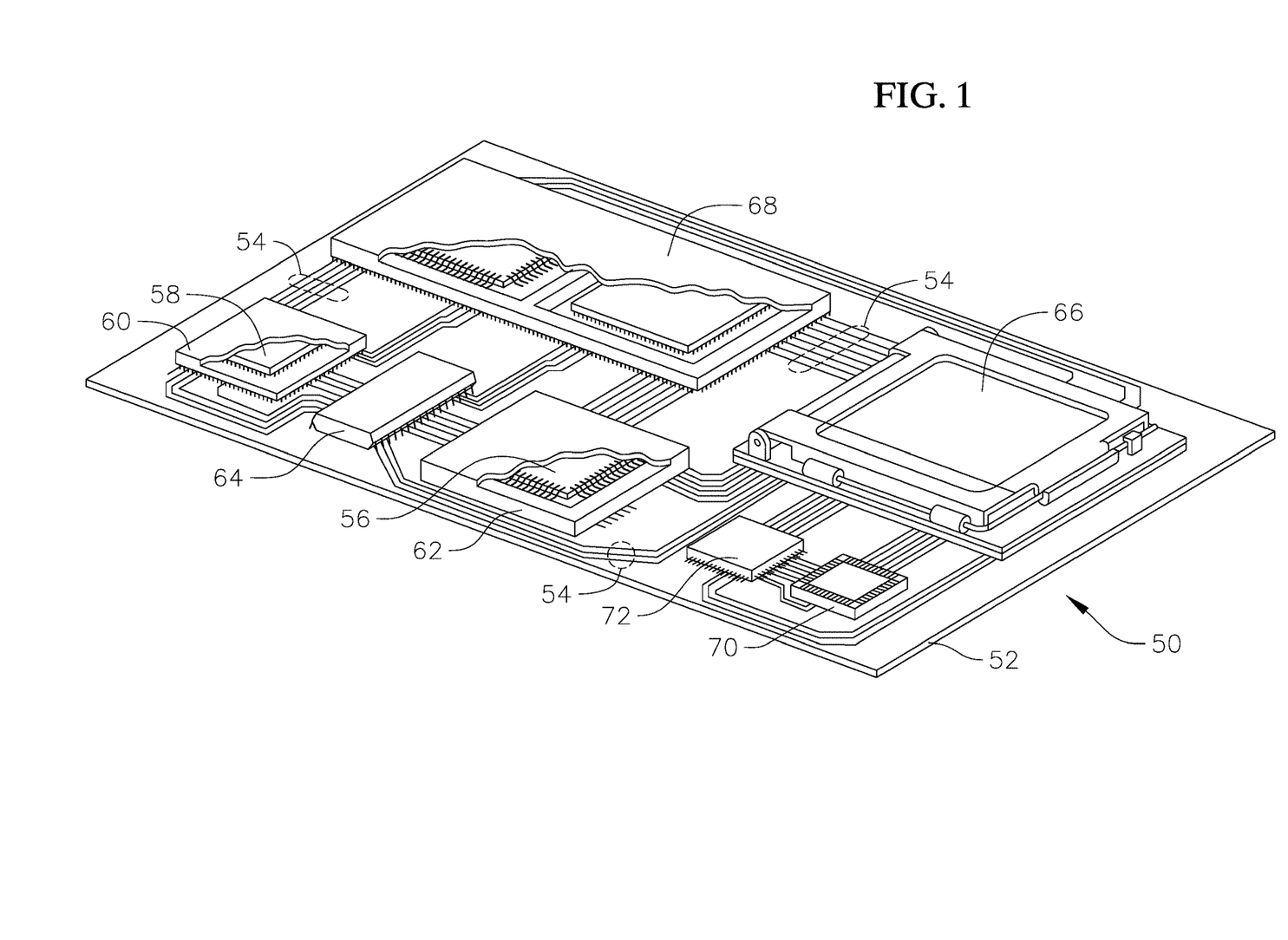
FIG. 1 illustrates an electronic device with various semiconductor packages mounted to its surface, according to some example embodiments.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. According to some embodiments, the electronic device 50 may be a memory device configured to store electronic data. The semiconductor packages can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system design, any combination of semiconductor packages, configured with any combination of first and second level packaging styles, as well as other electronic components, can be connected to PCB 52. In some embodiments, electronic device 50 includes a single attached semiconductor package, while other embodiments may include multiple interconnected packages.

Figure 2A:
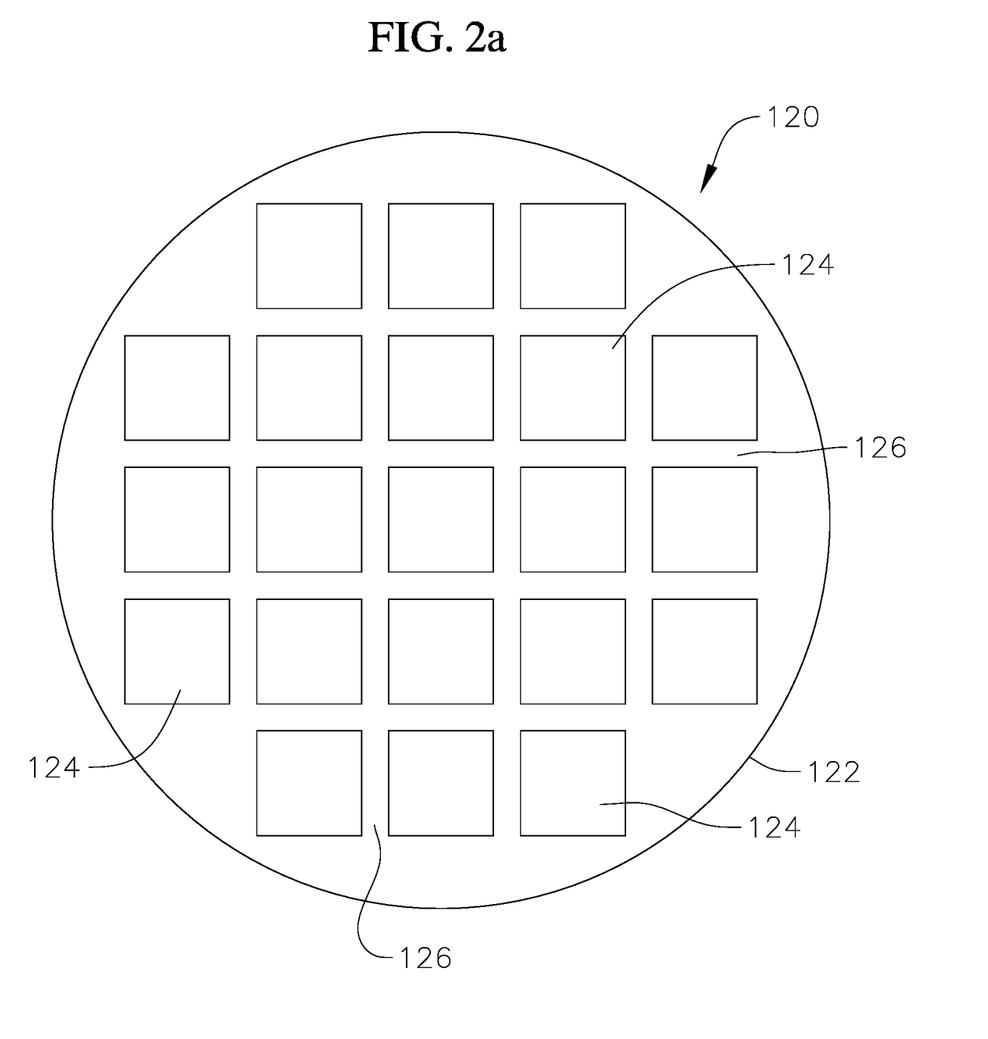
FIGS. 2a-2c illustrate a semiconductor wafer with a plurality of semiconductor die, according to some example embodiments.

FIG. 2a shows a semiconductor wafer 120 with a base substrate material 122, such as silicon, germanium, gallium arsenide, indium phosphide, or silicon carbide, for structural support. A plurality of semiconductor die or components 124 is formed on semiconductor wafer 120 separated by a non-active, inter-die wafer area or saw street 126 as described above. Saw street 126 provides cutting areas to singulate semiconductor wafer 120 into individual semiconductor die 124.

Figure 2B:
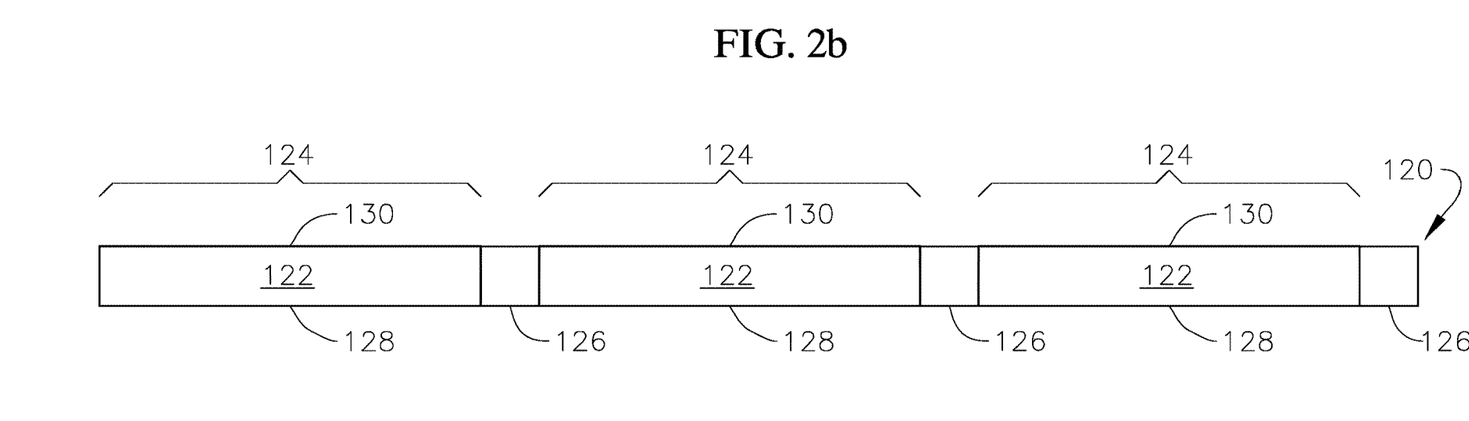

FIG. 2b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

Figure 2C:
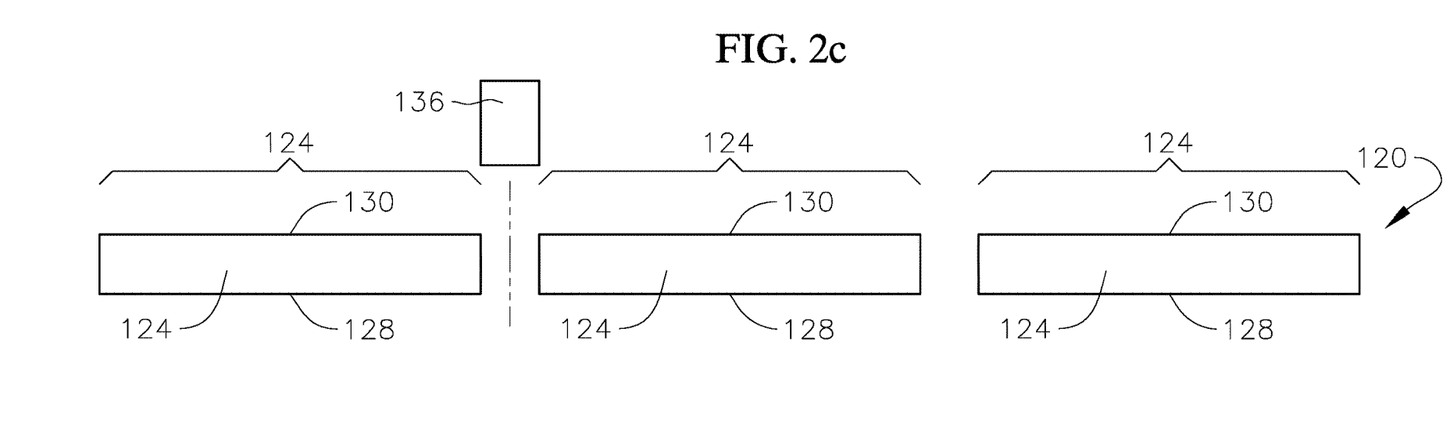

In FIG. 2c, semiconductor wafer 120 is singulated through saw street 126 using a saw blade or laser cutting tool 136 into individual semiconductor die 124.

As technology has enabled reducing or scaling down the size and footprint of active and passive components, interconnection line and via sizes may also be reduced to enable smaller chip and package sizes. As interconnection line and via sizes are reduced, however, resistance in the interconnection lines and vias may increase.

During a related-art manufacturing process, barrier and liner layers may be deposited on the bottom and side wall of vias, which may further contribute to the via resistance being undesirably high, due to the relatively high resistivities of barrier and liner layers. Alternative metallization techniques using, for example, Cobalt or Ruthenium, may be utilized in an effort to thin down or etch the barrier layer at the bottom of the via, but the manufacturing process is difficult and prone to errors, and can result in via resistance variation due to varying presence of residue after etching or incomplete etching.

Accordingly, example embodiments of the present invention include a semiconductor device and a method of manufacturing a semiconductor device that mitigates via resistance increases as components are scaled down in size. For example, according to some example embodiments, resistance contributing elements may be removed from the bottom of the via using a selective deposition manufacturing process, thereby enabling the conductive material filled in the via to make a better electrical and mechanical connection to the underlying conductive material of the trace or line.

FIGS. 3a-3l show a process of forming an interconnect structure in a semiconductor device 300 according to some example embodiments. Although FIGS. 3a-3k illustrate an example embodiment in which an interconnect structure is formed directly over a portion of the active surface 130 of semiconductor die 124, embodiments of the present invention are not limited thereto. For example, according to some example embodiments, various other layers and components may be positioned between the interconnect structure and the semiconductor die 124. According to other embodiments, the interconnect structure may be formed to electrically connect various components or die to each other.

Figure 3A:
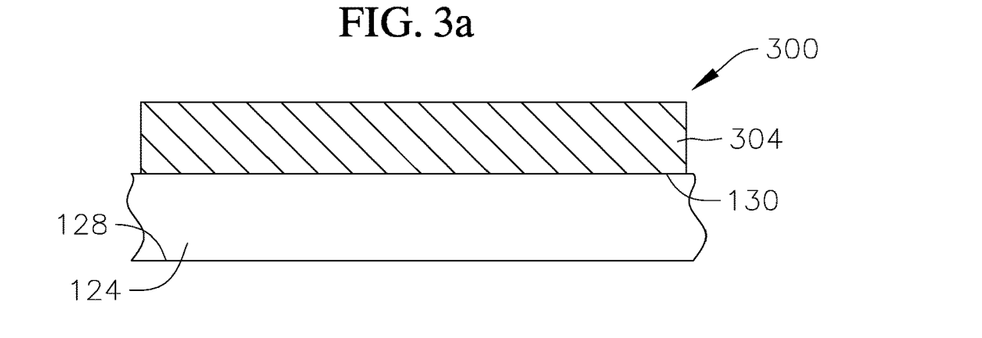
FIGS. 3a-3l show a process of forming an interconnect structure in a semiconductor device, according to some example embodiments.

As shown in FIG. 3a, an electrically conductive layer 304 is formed over a substrate (e.g., the semiconductor die 124), for example, as a signal or power line between various active or passive components of the semiconductor device 300. The conductive layer 304 may be formed using a patterning and metal deposition process such as printing, chemical vapor deposition (CVD), physical vapor deposition (PVD), sputtering, electrolytic plating, electroless plating, or any other suitable electrically conductive material deposition process. The conductive layer 304 may include one or more layers of, for example, aluminum (Al), copper (Cu), tin (Sn), nickel (Ni), gold (Au), or silver (Ag), or any other suitable electrically conductive material.

Figure 3B:
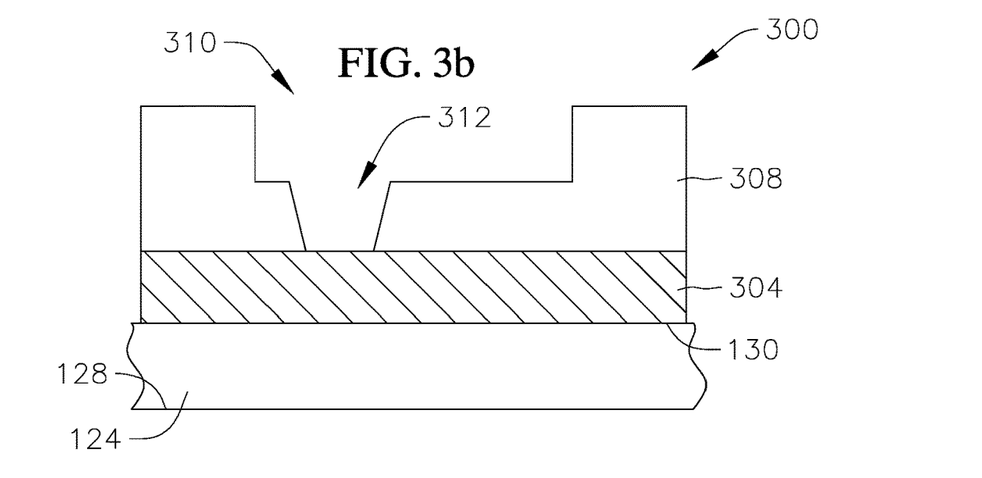

As shown in FIG. 3b, an insulating or passivation layer 308 is formed over the conductive layer 304 using CVD, PVD, printing, spin coating, spray coating, sintering, thermal oxidation, or any other suitable insulating material deposition process. The insulating layer 308 may be any suitable insulating material or low-k dielectric material, for example one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties.

An opening 310 may then be formed through the insulating layer 308, the opening 310 including at least one via 312 to expose the conductive layer 304 through the via 312 and the opening 310. The opening 310 and the via 312 may be formed by removing the corresponding portion of the insulating layer 308 using any suitable etching process such as a dual damascene patterning process.

Figure 3C:
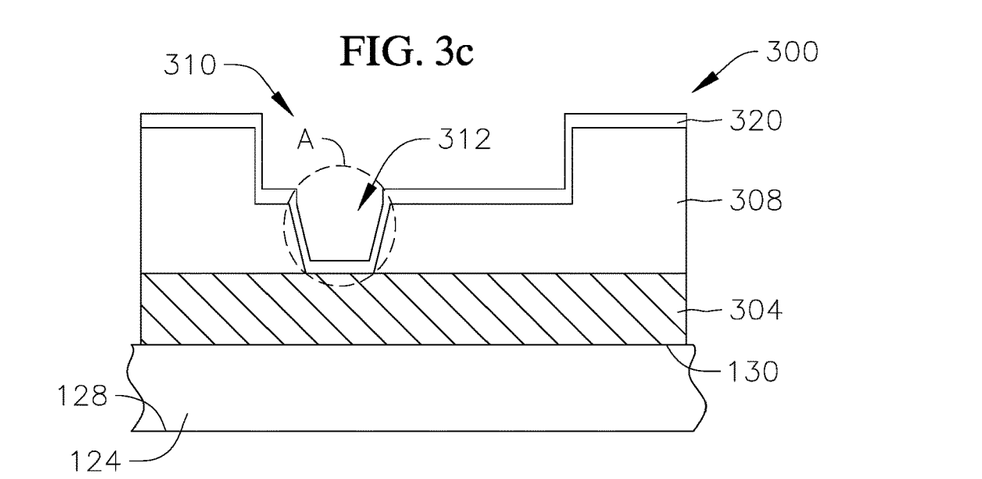

After the opening 310 and the via 312 are formed in the insulating layer 308, a self-assembled monolayer (SAM) (or molecular layer including a plurality of layers of SAMs) 320 is formed over the insulating layer 308, over the exposed side walls and surfaces of the opening 310 and the via 312, and over the portion of the conductive layer 304 exposed through the via 312. The SAM 320 may be deposited using, for example, any suitable directional deposition process. The SAM 320 may be an organic material or any suitable SAM material such as perylenetetracarboxylic dianhydride (PTCDA), highly oriented pyrolitic graphite (HOPG), dithiol 1,4-Benzenedimethanethiol ($SHCH_2C_6H_4CH_2SH$), or any other suitable self-assembled monolayer or molecular layer material having similar properties suitable for directional deposition.

Figure 3D:
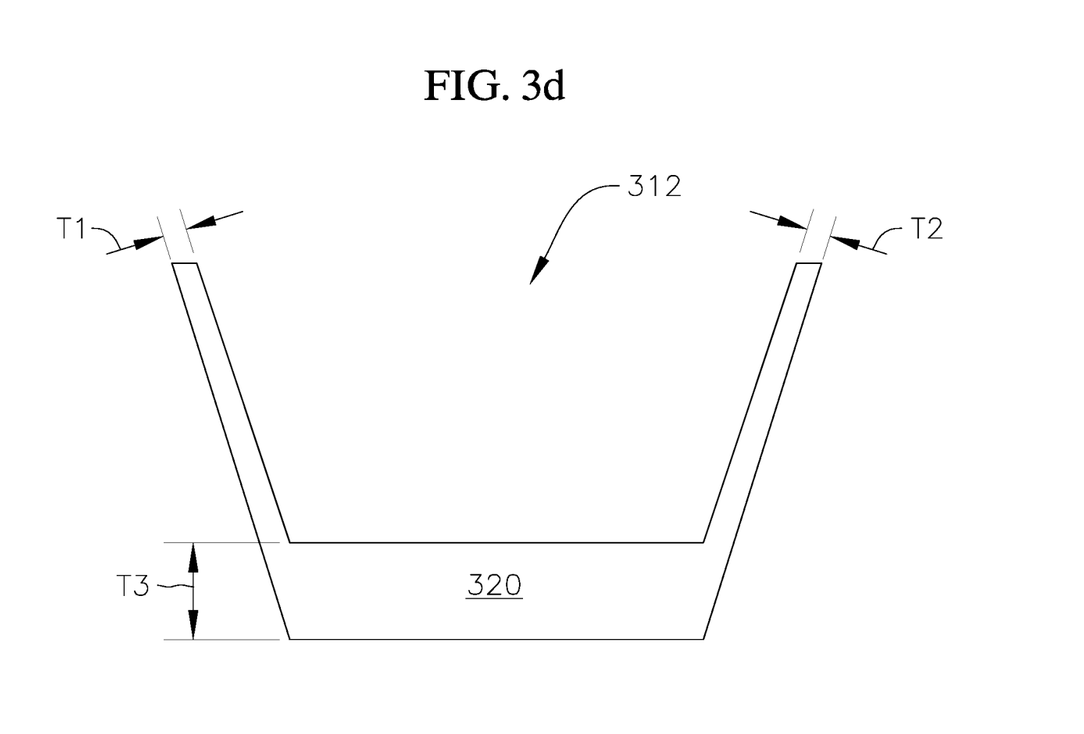

FIG. 3d shows further details of the portion "A" of the SAM 320 shown in FIG. 3c that is located within the via 312. As shown in FIG. 3d, the thicknesses T1 and T2 of the SAM 320 along the sidewall of the via 312 are less than the thickness T3 of the SAM 320 at the bottom of the via 312 due to the directional deposition process of the SAM 320 material. Accordingly, as will be illustrated and described in more detail below, during a later etching process to remove the sidewall portions of the SAM 320, the portion of the SAM 320 at the bottom of the via 312 may remain in place, albeit with a decreased thickness, to cover the underlying layer (e.g., the conductive layer 304).

Figure 3E:
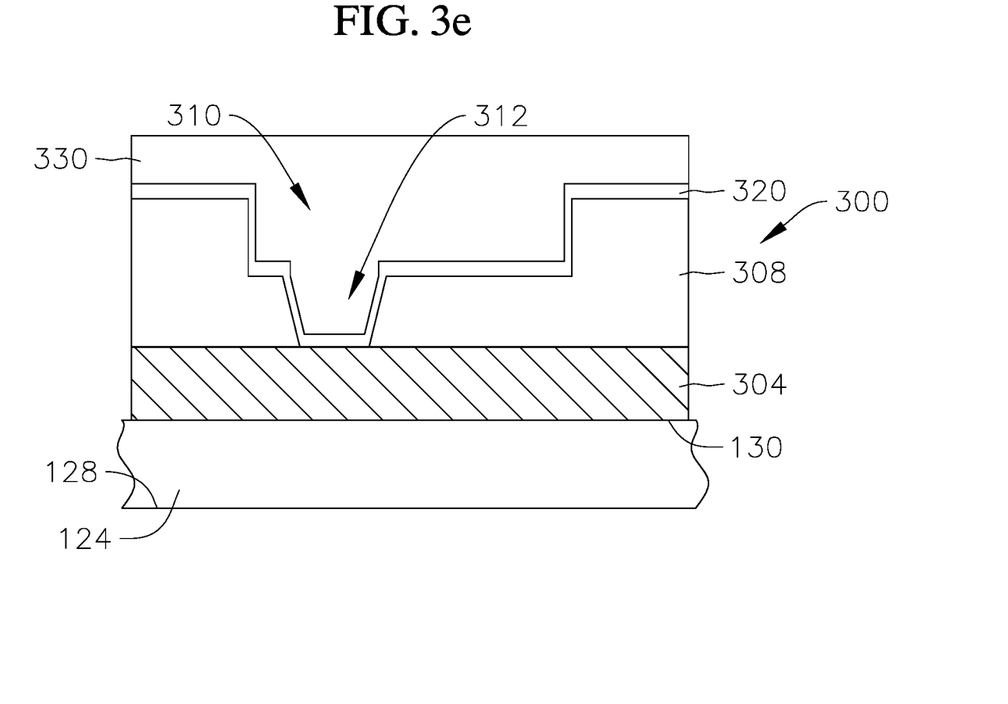

Continuing after FIG. 3c, as shown in FIG. 3e, a sacrificial organic or optical planarization layer 330 may be formed over the SAM 320, including within the opening 310 and the via 312 in order to fill the via 312.

Figure 3F:
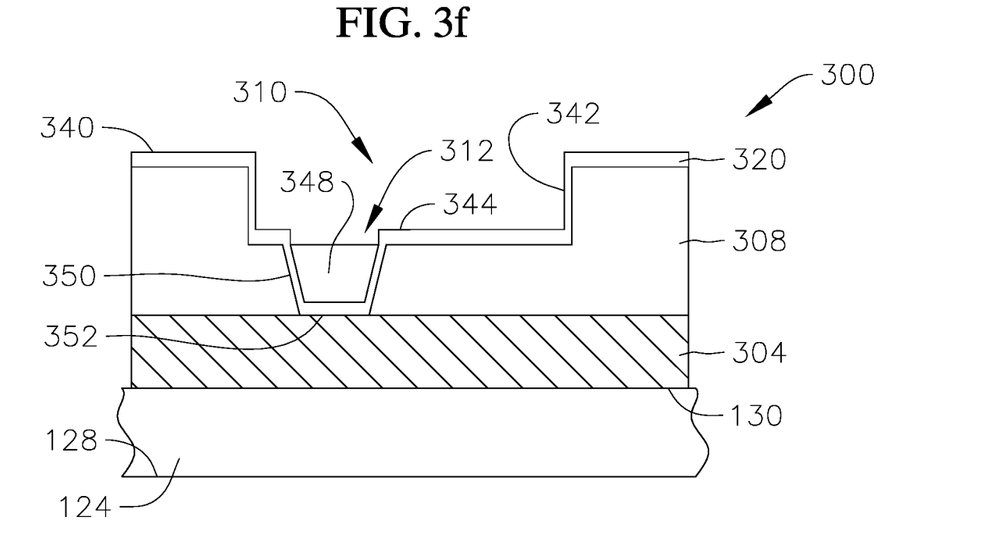

As shown in FIG. 3f, the portion of the sacrificial layer 330 that is not within the via 312 is removed from the SAM 320 to expose the SAM 320 outside of the via 312 using any suitable etching process without removing the SAM 320. That is, after removing the portion of the sacrificial layer 330 that is not within the via 312, the top surface 340 of the SAM 320 remains in place and is exposed. Additionally, the portion 342 of the SAM 320 at the side wall of the opening 310, and the portion 344 of the SAM 320 at the bottom of the opening 310 also remain in place and are exposed after removing the portion of the sacrificial layer 330 that is not within the via 312. The portion 348 of the sacrificial layer 330 within the via 312 is not removed and maintains coverage over the portion 350 of the SAM 320 at the sidewall of the via 312 and the portion 352 of the SAM 320 at the bottom of the via 312.

Figure 3G:
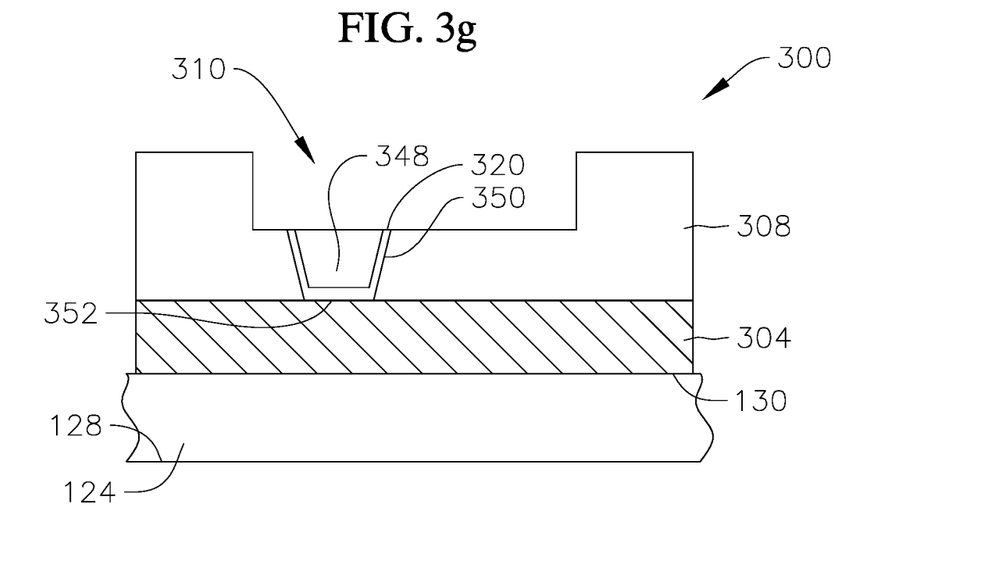

As illustrated in FIG. 3g, while the portion 348 of the sacrificial layer 330 within the via 312 maintains coverage over the portion 350 and the portion 352 of the SAM 320, the remainder of the SAM 320 that is not covered by the sacrificial layer 330 is removed from the insulating layer 308, including within the opening 310.

Figure 3H:
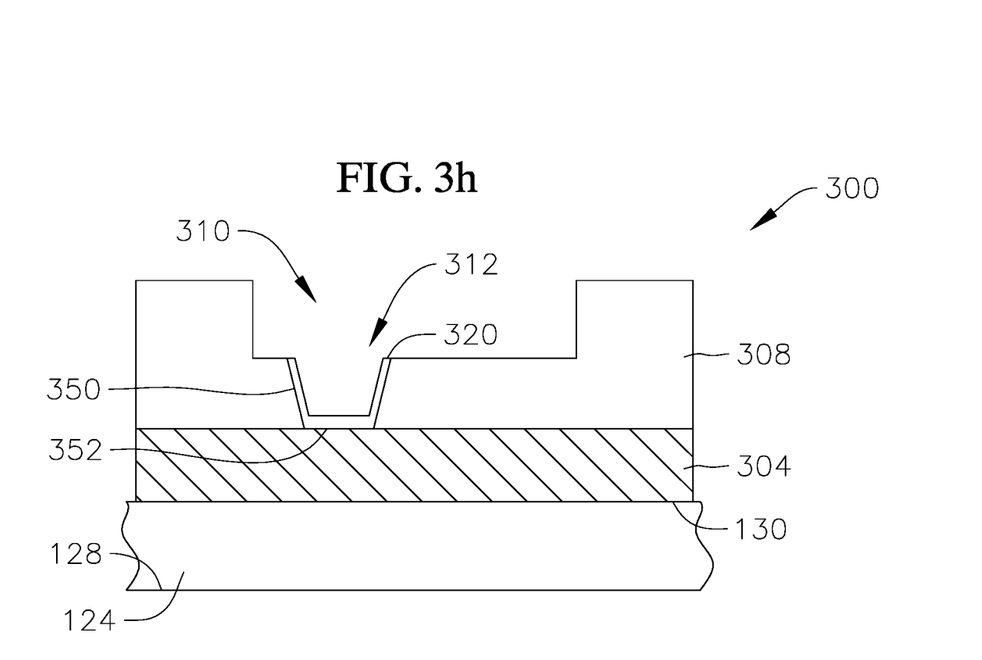

After removing the portion of the SAM 320 that is not covered by the sacrificial layer 330 (i.e., the portion of the SAM 320 that is not within the via 312), the remainder of the sacrificial layer 330 may be removed, as illustrated in FIG. 3h, to expose the portion 350 of the SAM 320 along the sidewall of the via 312 and the portion 352 of the SAM 320 at the bottom of the via 312.

Figure 3I:
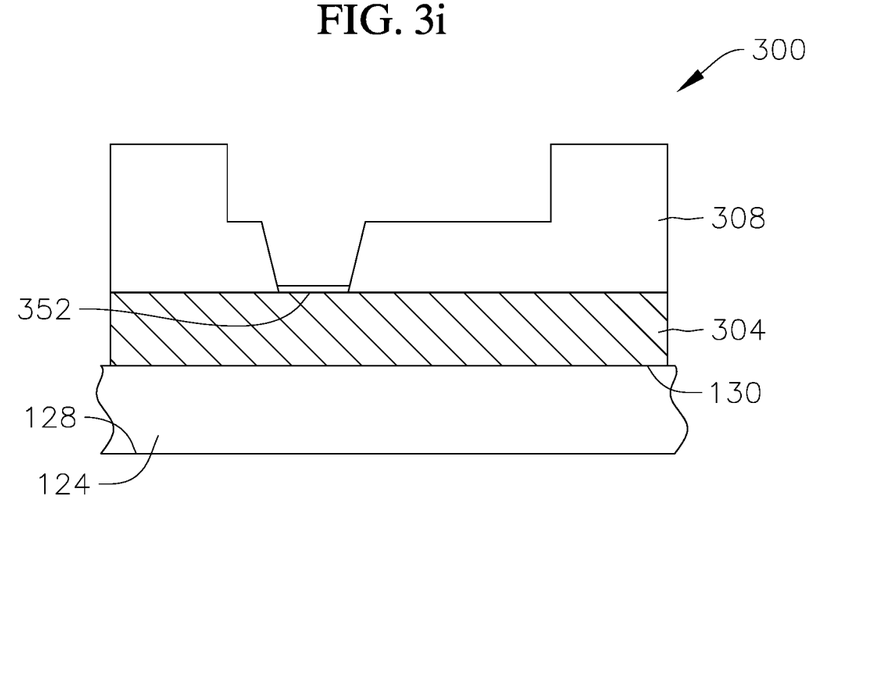

As shown in FIG. 3i, the portion 350 of the SAM 320 at the sidewall of the via 312 is removed using any suitable etching process, while leaving the portion 352 of the SAM 320 at the bottom of the via 312 in place to maintain coverage over the underlying layer (e.g., the conductive layer 304). After removing the portion 350 of the SAM 320 at the sidewall of the via 312, the thickness of the portion 352 of the SAM 320 at the bottom of the via 312 may have a decreased thickness compared to prior to removal of the portion 350 due to the etching of process to remove the portion 350. Because the portion 352 initially had a greater thickness than that of the portion 350, however, the portion 352 may remain in place to maintain coverage over the underlying layer (e.g., the conductive layer 304) with the reduced thickness.

Figure 3J:
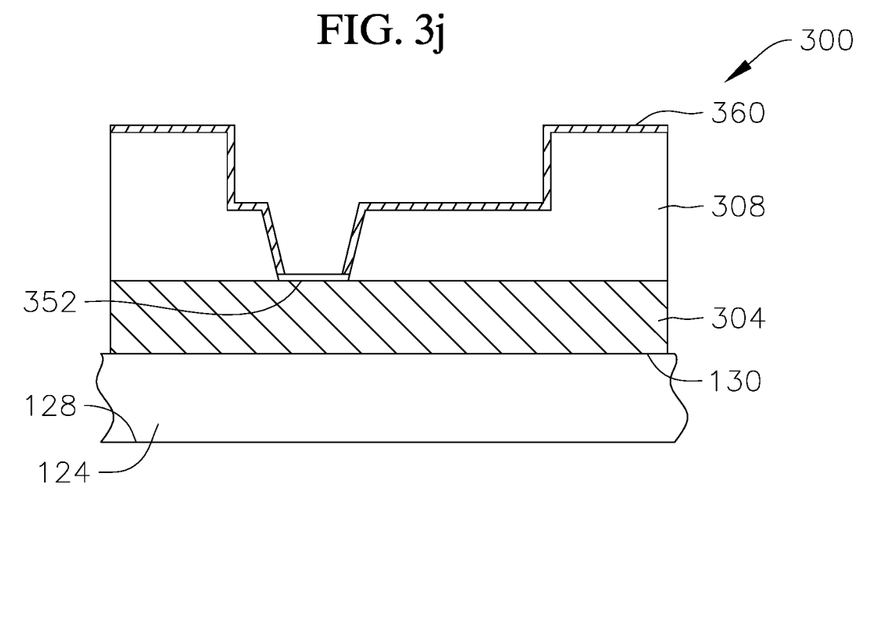

Next, as shown in FIG. 3j, a barrier layer 360 may be selectively deposited over the insulating layer 308, including within the opening 310 and along the sidewalls of the via 312. The barrier layer 360 may be deposited using a deposition process such as printing, CVD, PVD, sputtering, electrolytic plating, electroless plating, or any other suitable barrier material deposition process. The barrier layer 360 may be any suitable barrier layer material including, for example, silicide, for providing a conductive interface and preventing contamination of semiconductor materials due to subsequent deposition of conductive material within the opening 310.

Figure 3K:
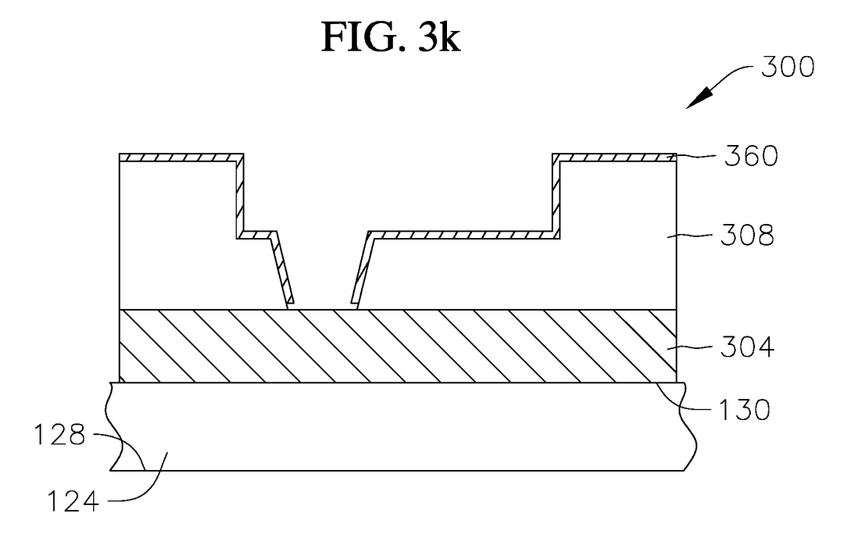

Because the portion 352 of the SAM 320 remains at the bottom of the via 312 during deposition of the barrier layer 360, and because the SAM 320 has a repelling property with respect to the material of the barrier layer 360, the barrier layer 360 is not deposited over the bottom portion of the via 312 and the remaining portion 352 of the SAM 320. Instead, the barrier layer 360 is only selectively deposited at desired locations without being deposited at undesired locations (i.e., the junction at the bottom of the via 312). After the barrier layer 360 is deposited, however, the remaining portion 352 of the SAM 320 may be removed by any suitable etching process to expose the underlying conductive layer 304 through the bottom of the via 312, as shown in FIG. 3k.

Figure 3L:
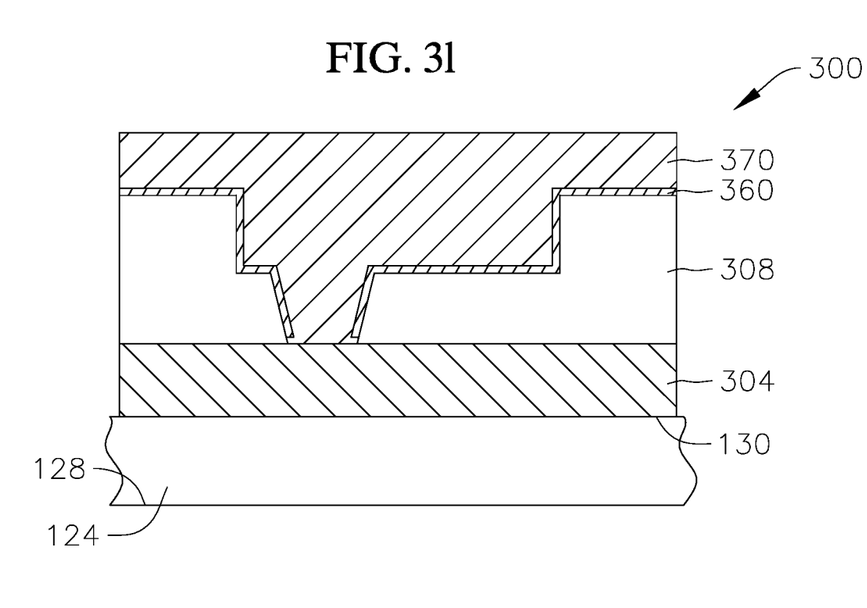

As shown in FIG. 3l, after the remainder of the SAM 320 is removed and the barrier layer 360 is deposited at the sidewalls of the via 312, without being deposited at the bottom of the via 312, a conductive material 370 may be deposited over the insulating layer 308, including within the via 312, using a patterning and metal deposition process such as printing, CVD, PVD, sputtering, electrolytic plating, electroless plating, or any other suitable electrically conductive material deposition process. The conductive layer 370 may include one or more layers of, for example, Al, Cu, Sn, Ni, Au, or Ag, or any other suitable electrically conductive material. The conductive layer 370 therefore may form an interconnect structure that is electrically connected to the conductive layer 304 and may be connected to other active or passive components of the semiconductor device 300 according to the circuit structure of the semiconductor device 300.

Thus, as described above, according to some example embodiments, a conductive layer may be deposited or formed on a substrate, and an insulating or dielectric material may be deposited over the conductive layer. Using a lithography or etching process (e.g., single or dual damascene process), one or more vias may be formed through the insulating material to expose the conductive material.

A directional self-assembled monolayer (SAM) or molecular layer (ML) (e.g., an organic blocking layer) is deposited over the exposed insulating layer and conductive layer. Because of the directional deposition process of the SAM or ML, the SAM or ML has a greater thickness at the flat surfaces compared to sidewalls of openings (e.g., within the one or more vias).

An organic sacrificial layer (e.g., an optical planarization layer) may be formed over the SAM or ML, and is then recessed until it is removed from areas outside of the vias, while maintaining coverage over the SAM or ML within the vias. Accordingly, after depositing and recessing the organic sacrificial layer, the SAM or ML is exposed.

The SAM or ML that is not covered by the organic sacrificial layer is then removed using a suitable etching process, and then the organic sacrificial layer is removed from the via to expose the SAM or ML within the vias.

The SAM or ML is then removed from the sidewalls of the vias. Because of the thickness difference between the portion of the SAM or ML at the sidewalls of the vias compared to the bottom of the vias, an isotropic etch process can remove the SAM or ML at the sidewall, while maintaining the SAM or ML at the bottom of the via.

A barrier layer is then deposited, but because of the repelling properties of the SAM or ML relative to the barrier layer material, the barrier layer is not deposited at the location of the remaining SAM or ML. After the barrier layer is deposited, the remainder of the SAM or ML at the bottom of the via may be removed to expose the underlying first conductive layer. A second conductive layer may then be deposited over the barrier layer and within the via, including at the bottom of the via where there is no barrier layer. Accordingly, the second conductive layer may be electrically and mechanically connected to the first conductive layer without the barrier layer being between the first and second conductive layers at the bottom of the via, which may improve electrical conductivity between the first and second conductive layers because of the lack of the barrier layer at the bottom of the via.

Thus, example embodiments of the present invention may include a semiconductor device having an interconnect structure in which a barrier layer may be deposited on the sidewalls of a via for two interconnecting conductive layers without the barrier layer being located at the bottom of the via. Thus, example embodiments may improve the electrical conductivity between the two interconnecting conductive layers and prevent increased resistance between the two interconnecting conductive layers that may otherwise be caused due to the presence of a barrier layer at the bottom of the via.

Although this disclosure has been described in certain specific embodiments, those skilled in the art will have no difficulty devising variations to the described embodiment, which in no way depart from the scope of the present disclosure. Furthermore, to those skilled in the various arts, the disclosure itself herein will suggest solutions to other tasks and adaptations for other applications. It is the applicant's intention to cover by claims all such uses of the disclosure and those changes and modifications which could be made to the embodiments of the disclosure herein chosen for the purpose of disclosure without departing from the scope of the disclosure. Thus, the present embodiments of the disclosure should be considered in all respects as illustrative and not restrictive, the scope of the disclosure to be indicated by the appended claims and their equivalents rather than the foregoing description.

What is claimed is:

1. A method of making a semiconductor device, the method comprising:
    forming a first conductive layer over a substrate;
    forming an insulating layer on the first conductive layer;
    forming a via through the insulating layer to expose the first conductive layer;
    forming a self-assembled monolayer (SAM) over the insulating layer, a sidewall of the via, and a bottom of the via in contact with the first conductive layer;
    removing a first portion of the SAM over the insulating layer, while leaving a second portion of the SAM at the sidewall of the via and the bottom of the via;
    removing the SAM from the sidewall of the via, while leaving the SAM at the bottom of the via;
    forming a barrier layer at the sidewall of the via;
    removing the SAM from the bottom of the via to expose the first conductive layer; and
    forming a second conductive layer over the barrier layer and the bottom of the via such that the first conductive layer is electrically connected to the second conductive layer without the barrier layer between the first conductive layer and the second conductive layer at the bottom of the via.

2. The method of claim 1, further comprising, after forming the SAM over the insulating layer, the sidewall of the via, and the bottom of the via, forming a sacrificial layer over the SAM.

3. The method of claim 2, wherein the sacrificial layer comprises an organic material.

4. The method of claim 2, further comprising removing a first portion of the sacrificial layer outside of the via, while leaving a second portion of the sacrificial layer inside the via to maintain coverage over the SAM within the via.

5. The method of claim 4, further comprising removing the first portion of the SAM over the insulating layer, wherein prior to being removed, the first portion of the SAM is not covered by the second portion of the sacrificial layer.

6. The method of claim 5, further comprising removing the second portion of the sacrificial layer inside the via to expose the SAM within the via.

7. The method of claim 1, wherein, prior to removing the SAM at the sidewall of the via, the SAM at the sidewall of the via has a thickness that is less than a thickness of the SAM at the bottom of the via.

8. A method of making a semiconductor device, the method comprising:
    forming a first conductive layer over a substrate;
    forming an insulating layer on the first conductive layer;
    forming a via through the insulating layer to expose the first conductive layer;
    forming a self-assembled monolayer (SAM) over a sidewall and a bottom of the via;
    forming a barrier layer at a sidewall of the via;
    removing the SAM over the bottom of the via; and
    forming a second conductive layer over the barrier layer and the bottom of the via such that the first conductive layer is electrically connected to the second conductive layer without the barrier layer between the first conductive layer and the second conductive layer at the bottom of the via.

9. The method of claim 8, further comprising removing the SAM at the sidewall of the via, while leaving the SAM at the bottom of the via.

10. The method of claim 9, wherein, prior to removing the SAM at the sidewall of the via, a thickness of the SAM at the sidewall of the via is less than a thickness of the SAM at the bottom of the via.

11. The method of claim 8, further comprising, after forming the SAM at the sidewall of the via, and the bottom of the via, forming a sacrificial layer over the SAM.

12. The method of claim 11, wherein the sacrificial layer comprises an organic material.

13. The method of claim 8, further comprising forming the SAM over the insulating layer.

14. The method of claim 13, further comprising removing a first portion of the SAM over the insulating layer, while leaving a second portion of the SAM at the sidewall and the bottom of the via.

15. A method of making a semiconductor device, the method comprising:
   forming a first conductive layer over a substrate;
   forming an insulating layer on the first conductive layer;
   forming a via through the insulating layer to expose the first conductive layer;
   forming a self-assembled monolayer (SAM) at a sidewall of the via;
   forming a barrier layer at the sidewall of the via, without forming the barrier layer at a bottom of the via; and
   forming a second conductive layer over the barrier layer and the bottom of the via.

16. The method of claim 15, further comprising forming the SAM over the bottom of the via prior to depositing the barrier layer.

17. The method of claim 16, further comprising removing the SAM from the bottom of the via prior to depositing the second conductive layer.

18. The method of claim 17, wherein:
   forming the SAM at the sidewall of the via and the bottom of the via is prior to forming the barrier layer; and
   the method further comprises removing the SAM at the sidewall of the via, wherein, prior to removing the SAM at the sidewall of the via, a thickness of the SAM at the sidewall of the via is less than a thickness of the SAM at the bottom of the via.

* * * * *